(12) United States Patent
Bakker

(10) Patent No.: US 7,034,923 B2
(45) Date of Patent: Apr. 25, 2006

(54) OPTICAL ELEMENT, LITHOGRAPHIC APPARATUS COMPRISING SUCH OPTICAL ELEMENT AND DEVICE MANUFACTURING METHOD

(75) Inventor: Levinus Pieter Bakker, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/760,558

(22) Filed: Jan. 21, 2004

(65) Prior Publication Data

US 2005/0157282 A1 Jul. 21, 2005

(51) Int. Cl.
*G03B 27/54* (2006.01)
*G03B 27/42* (2006.01)
*G03B 21/60* (2006.01)

(52) U.S. Cl. ............... 355/67; 355/53; 359/452
(58) Field of Classification Search .......... 355/30, 355/53, 67–71; 359/359–361, 452; 428/402
See application file for complete search history.

(56) References Cited

U.S. PATENT DOCUMENTS

| 6,140,016 | A | 10/2000 | Suzuki et al. | |
| 6,859,310 | B1* | 2/2005 | Simpson et al. | 359/359 |
| 6,870,602 | B1* | 3/2005 | Ishizawa et al. | 355/67 |
| 2002/0191168 | A1 | 12/2002 | Ishizawa et al. | |
| 2004/0233526 | A1* | 11/2004 | Kaminsky et al. | 359/452 |
| 2005/0117217 | A1* | 6/2005 | Yamaoka et al. | 359/483 |

FOREIGN PATENT DOCUMENTS

| EP | 0 973 049 A1 | 1/2000 |
| EP | 1 197 803 A2 | 4/2002 |
| GB | 2 255 483 | 11/1992 |

OTHER PUBLICATIONS

Lohmann, M., et al., Structural Investigations on Ultrathin Mo Layers in a-Si:H with Emphasis on the Island-Continuous Layer Transition, Thin Solid Films 342 (1999), pp. 127-135.
European Search Report for EP 05 07 5155 dated Apr. 12, 2005.

* cited by examiner

*Primary Examiner*—Henry Hung Nguyen
(74) *Attorney, Agent, or Firm*—Pillsbury Winthrop Shaw Pittman, LLP

(57) ABSTRACT

An optical element includes a substrate having at least one surface on which a layer of material is disposed, the layer of material being selected to be at least partially transmissive to radiation with a predetermined wavelength $\lambda$. The surface of material includes particles having a diameter in a range of 1–500 nm and the layer of material has a layer thickness in the range of 10–2000 nm. Undesired radiations, e.g. UV and DUV radiations, are substantially reduced or eliminated by scattering, e.g. Mie scattering and/or Raleigh scattering, and/or by absorption by the particles while desired radiations are transmitted to the surface of the optical element.

21 Claims, 3 Drawing Sheets

OPTICAL ELEMENT, LITHOGRAPHIC APPARATUS COMPRISING SUCH OPTICAL ELEMENT AND DEVICE MANUFACTURING METHOD

BACKGROUND OF THE INVENTION

1. Field of the Invention

This invention relates to an optical element, a lithographic apparatus comprising such optical element and to a device manufacturing method.

2. Brief Description of Related Art

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In a lithographic apparatus the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources include, for instance, laser-produced plasma sources, discharge plasma sources, or synchrotron radiation from electron storage rings.

Some extreme ultraviolet sources, especially plasma sources, emit radiation over a wide range of frequencies, even including infrared (IR), visible, ultraviolet (UV) and deep ultraviolet. These unwanted frequencies will propagate and cause heating problems in the illumination and projection systems and cause unwanted exposure of the resist if not blocked. Although the multilayer mirrors of the illumination and projection systems are optimized for reflection of the desired wavelength e.g. 13 nm, they are optically flat and have quite high reflectivities at IR, visible and UV wavelengths. It is therefore desirable to select from the source a relatively narrow band of frequencies for the projection beam. Even where the source has a relatively narrow emission line, it is desirable to reject radiation out of that line, especially at longer wavelengths. It has been proposed to use a thin membrane as a filter to perform this function. However, such a film is very delicate and becomes very hot, 200–300° C. or more, leading to high thermal stresses and cracking, sublimation and oxidation in the high power levels necessary in a lithographic projection apparatus. A membrane filter also generally absorbs at least 50% of the desired radiation.

EP 1197803 describes a lithographic projection apparatus wherein a grating spectral filter is used in the radiation system of the lithographic projection apparatus. This grating spectral filter is designed for passing radiation of desired wavelengths to form a projection beam and for deflecting radiation of undesired wavelengths. The grating spectral filter is substantially formed of a material having a complex refractive index close to unity at the desired wavelengths and includes silicon protrusions (this structure is 'invisible' for the EUV radiation). The protrusions have a laminar sawtooth profile or a laminar square wave profile (FIGS. 3 and 4 of EP 1197803, respectively).

In this arrangement, however, the Si protrusions of spectral filters of EP 1107803 may easily be damaged, which may have a detrimental effect on the optical filter properties. Furthermore, the infra red (IR) radiations may not efficiently be blocked with the optical element of EP 1197803.

SUMMARY OF THE INVENTION

It is therefore an aspect of the invention to provide an alternative optical element that enables substantial transmission or reflection, or both transmission and reflection, of radiations with desired wavelengths (like e.g. EUV) and substantially reduces or eliminates radiations with undesired wavelengths (like e.g. radiations selected from the group consisiting of one or more of VUV, DUV, UV, VIS, and IR radiation). It is a further aspect of the invention to provide a lithographic apparatus, wherein the intensity of radiation selected from one or more of VUV, DUV, UV, VIS, and IR radiation that reaches a substrate is diminished. It is also an aspect of the invention to provide a method for diminishing the intensity of radiation selected from one or more of VUV, DUV, VIS and IR radiation in a radiation beam of an optical system. It is yet a further aspect of the invention to provide a device manufacturing method.

According to an embodiment of the present invention, there is provided an optical element comprising a substrate having at least one surface on which a layer of material is disposed, said layer of material being selected to be at least partially transmissive to radiation with a predetermined wavelength λ, wherein the layer of material includes particles having a diameter in a range of 1–500 nm; and wherein the layer of material has a layer thickness in the range of 10–2000 nm.

With such an optical element, the intensity of an undesired radiation, e.g. UV and DUV radiation, in a beam of radiation (e.g. projected with a certain angle of incidence) may be diminished due to either scattering, e.g. Mie scattering and/or Raleigh scattering of this radiation by the particles, or due to absorption by the particles, or due to both scattering and absorption of the undesired radiation. By contrast, with such an optical element, a desired radiation, especially EUV radiation for example, may substantially be transmitted through the surface layer, since the surface layer is transmissive to this radiation. As a result, the desired radiation may reach the surface of the optical element.

The layer of material, or surface layer, of the present invention can be provided on the optical element, e.g. by coating (like dip coating), spraying, etc. Since the surface layer entirely comprises particles, a small damage to the layer may have a small effect on the optical properties of the optical element, e.g. since only a number of particles are (re)moved.

In an embodiment of the present invention, the particles are composed of a material having a relatively low imaginary part of the complex index of refraction for the radiation of wavelength $\lambda$. The complex index of refraction is defined as $\tilde{n}=n-j*k$, wherein n is the real part of the complex index of refraction, and k is the imaginary part. For example, for EUV applications (wherein the particles are at least partially transmissive for EUV radiation), the surface layer of the optical element may be a layer wherein the particles include a material selected from at least one of Be, B, C, Si, P, S, K, Ca, Sc, Br, Rb, Sr, Y, Zr, Nb, Mo, Ru, Rh, Ag, Ba, La, Ce, Pr, Ir, Au, Pa and U. In an embodiment of the present invention, combinations of materials may also be chosen, like $B_4C$ or SiC, etc.

In an embodiment of the present invention, there is provided an optical element, wherein the particles include a material having a complex refractive index close to unity at a predetermined wavelength $\lambda$. In a further embodiment of the invention, the particles include a material selected from at least one of Si, K and Rb (n−1≦0.01 for EUV radiation), since these elements have a complex index of refraction relatively close to unity with respect to other elements. For example, the optical element may be one wherein the particles include Si. An advantage of using Si is that Si is transmissive for EUV radiation and is also "invisible" for EUV radiation (e.g. a EUV radiation of about 13.5 nm). This is due to the fact that the complex index of refraction of Si is close to 1, and is even closer to 1 than K or Rb are. In another embodiment of the invention, the particles include a material selected from at least one of Be, P, K, S, Ca, Sr and Ba (n−1≦0.02 for EUV radiation), and in yet another embodiment of the present invention, the particles include a material selected from at least one of B, C, Sc, Y and Zr (n−1≦0.05 for EUV radiation). Hence, in a further embodiment of the present invention, the particles include a material having a complex index of refraction for EUV radiation defined by n−1≦0.05, e.g. n−1≦0.02 or e.g. n−1≦0.01. Such materials are advantageously "invisible" for radiation with a desired wavelength $\lambda$ (and therefore radiations with desired wavelengths are not scattered, reflected, refracted or diffracted).

A parameter that may also influence the effect of the surface layer is the thickness of the layer. For example, it has been demonstrated that the greater the number of particles on the optical element, the stronger the effect will be (filtering out undesired wavelengths, e.g. by absorption of radiation with undesired wavelengths like DUV radiation).

It should be understood that the optical element of the invention may be one (or more) selected from optical filters, optical gratings, mirrors, and lenses.

In an embodiment of the present inventon, the surface layer comprises particles, having a diameter between 1–100 nm.

In another embodiment of the present invention, the surface layer has a layer thickness in a range of 10–500 nm, or may even have larger layer thicknesses. By selecting a layer thickness in this range, and by selecting an angle of incidence, reflected and/or transmitted radiations of the beam of radiation will comprise less IR radiation, due to destructive interference. In the present invention, a larger surface layer thickness may also enhance VUV, UV, DUV and VIS absorption. In a further embodiment of the present invention, the surface layer includes a layer thickness in a range of 10–200 nm In an embodiment of the present invention, there is provided an optical element, wherein the surface of material includes protrusions such that cavities and elevations are formed in the layer of material. Such protrusions can be used to create a grating structure. In this way, it is advantageously possible to provide an optical element that may diminish IR radiations. This is achieved by selecting a certain angle of incidence for the beam of radiation and by selecting maximum height differences, period of the protrusions, and widths and shapes of the protrusions. For example, in an embodiment of the present invention, there is provided an optical element wherein the protrusions are periodically arranged, and wherein a period of the protrusions is in the range of 200–5000 nm and the height difference is in the range of 10–500 nm.

According to another aspect of the invention, there is provided a lithographic apparatus including at least one optical element according to the invention. Such lithographic apparatus may include a radiation system constructed and arranged to provide a beam of radiation; a support structure constructed and arranged to supporting a patterning structure, the patterning structure constructed and arranged to pattern the beam according to a desired pattern; a substrate table to hold a substrate; a projection system constructed and arranged to project the patterned beam onto a target portion of the substrate; and at least one optical element within a path of the radiation including a substrate having at least one surface on which a layer of material is disposed, the layer of material being selected to be at least partially transmissive to radiation with a predetermined wavelength $\lambda$, wherein the surface of material includes particles having a diameter in a range of 1–500 nm; and wherein the layer of material has a layer thickness in the range of 10–2000 nm.

In yet another aspect of the invention, there is provided a method for diminishing the intensity of radiations selected from one or more of VUV, DUV, UV, VIS and IR radiation in a radiation beam of an optical system, the method including projecting the radiation beam onto at least one optical element according to the invention.

In a further aspect of the invention, the invention is directed to a device manufacturing method, wherein the optical elements of the invention are used. Such method may include: providing a beam of radiation; patterning the beam of radiation; projecting the patterned beam of radiation onto a target portion of a layer of radiation-sensitive material; passing the radiation through a layer of material disposed on at least one optical element, said layer of material being selected to be at least partially transmissive to radiation with a predetermined wavelength $\lambda$, wherein the surface of material includes particles having a diameter in a range of 1–500 nm; and wherein the layer of material has a layer thickness in the range of 10–2000 nm.

In another embodiment of the present invention, there is provided a method wherein a number of different optical elements is provided. For example, optical filters with different layer thicknesses or optical filters with different periodically arranged protrusions, or combinations thereof. In this way, one may filter out a broader range of wavelengths, e.g. in the IR.

According to yet another aspect of the invention, there is provided a device which is manufactured according to the method of the invention or with the apparatus according to the invention.

In the context of the present invention, "optical element" includes one or more elements selected from optical filters, optical gratings, mirrors, and lenses. Such optical elements, like filters, gratings, mirrors or lenses may be flat or curved and may be present as layer, foil, device etc. In an embodiment of the present invention, these optical elements may be blazed or optimized, e.g. for radiation with a predetermined wavelength $\lambda$. They may also be transmissive to radiation with wavelengths $\lambda$, e.g. in the case of lenses, or reflective, e.g. in case of mirrors, or diffractive, e.g. in the case of gratings. Some optical elements may provide one or more of these optical effects, see e.g. European Patent application no. 03077155 and European Patent application no. 03077850. The optical elements of the present invention include at least a surface of material including particles. The optical element may also include other layers, features, means, etc. In addition, it should be noted that these additional layers may also be disposed between the surface of the optical element and the surface layer according to the present invention.

The terms "transmissive" or "substantially transmissive" used herein mean that the transmission through a transmissive layer, e.g. an EUV transmissive layer, is larger than zero, preferably, e.g. at least 30%, or at least 50%, at least 70%, at least 80%, e.g. at least 90% or at least 95%, more preferably at least 98%.

The terms "not absorbed" or "substantially not absorbed" used herein mean that the absorption of radiation is less than 100%, preferably less than e.g. 70%, or less than 50%, or less than 30%, less than 20%, e.g. less than 10% or less than 5%, more preferably less than 2%. The terms "transmissive", as well as "not absorbed", do not only depend on the transmission or absorbance of the material, but also on other factors like, e.g. the layer thickness. In the context of the present invention, the term "invisible" means that the complex index of refraction ñ is close to unity (e.g. with n-1≦0.05 and with k≦0.01).

The terms "undesired radiation" or "undesired wavelength" used herein refer to radiations having wavelengths larger (or smaller) than the wavelength that is intended to be used. This means, for example, that when a EUV radiation with a wavelength λ of about 13.5 nm is desired, a radiation with a wavelength smaller than about 10 nm or larger than about 20 nm is not desired. This means that the phrase "radiation with wavelength λ" is not intended to be limited to a radiation with an infinite small bandwidth of λ. It should be understood that an optical element may be designed for one specific wavelength λ or a range of wavelengths. It should also be understood that an optical element may also be used at different wavelengths, e.g. due to second order effects, etc.

The term "layer" used herein describes layers having one or more boundary surfaces with other layers and/or with other media like vacuum (in use). However, it should be understood that "layer" may also mean part of a structure. The term "layer" may also indicate a number of layers. These layers can be, for example, next to each other or on top of each other, etc. They may also include one material or a combination of materials. It should also be noted that the term "layers" used herein describe continuous or discontinuous layers. For example, protrusions on a surface may also be seen as separate layers or as a discontinuous layer.

The term "packing" used herein can be described as an amount of filled volume. In this context, a 100% packing describes a continuous layer, with no empty space(s) (like, e.g. a Si layer). By contrast, a layer with Si particles is a layer wherein not all spaces between particles will be filled, In this assembly, a packing smaller than 100% will be obtained. The surface layer of the invention substantially includes particles. The terms "surface density" used herein describe the number of particles in a layer above a certain surface in particles per square meter.

In an embodiment of the present invention, the "height" of a surface layer including particles may vary over the surface of such layer due to small local height differences. Hence, the term "height" used herein refers to the mean height. It should be noted that the layer thickness or layer height can, e.g., be derived from packing and surface density (assuming continuous layers without protrusions).

In an embodiment of the present invention, the surface layer may include "protrusions". In another embodiment of the present invention, the optical element may comprise "protrusions". It should be understood that such protrusions are structures, with a certain height, width and length. These protrusions, located on a surface, may have a laminar sawtooth profile. In this arrangement, the protrusions have a sawtooth profile that is laminarly arranged on a (mirroring) surface. In an embodiment of the present invention, the profile can be arranged to form a (blazed) 1D grating, with a certain number of parallel lines (laminar sawtooth protrusions). In another embodiment of the present invention, the protrusions may also have a laminar square wave profile, wherein the protrusions have a square or rectangle structure, that is laminarly arranged on a surface. It should be understood that the profile can be arranged to form a 1D grating, with a certain number of parallel lines (laminar square wave protrusions).

It should also be understood that the protrusions may also be periodically arranged in two directions. For example, the protrusions may have a periodically structured sawtooth profile. In this arrangement, the protrusions can be, for example, cubes or rectangles, which have a sawtooth profile in one direction, that are periodically arranged, like a checkerboard. In an embodiment of the present invention, the profile can be arranged to form a (blazed) 2D grating, with a certain number of periodically arranged structures (periodical sawtooth protrusions). In a further embodiment of the present invention, there is provided a periodically arranged profile in two directions. This arrangement corresponds to a structure having a periodically structured square wave profile. In this arrangement, the protrusions can e.g. be cubes or rectangles that are periodically arranged, like a checkerboard. In an embodiment of the present invention the profile can be arranged to form a (blazed) 2D grating, with a certain number of periodically arranged cubes or rectangles (periodical square wave protrusions). When using such 2D profiles, the protrusions are arranged in a kind of block structure of sawtooth protrusions (free standing periodical sawtooth protrusions) or block protrusions (free standing periodical square wave protrusions; with cubes or rectangles), as disclosed, for example, in U.S. Pat. No. 6,469,827 or E. Hecht, "Optics", second edition, p. 430 (paragraph 10.2.7).

These protrusions or elevations form a "profile", e.g. a regular profile (like a grating), and provide on the surface of such optical elements "cavities" (areas which are deeper with respect to adjacent areas). These cavities can be seen as the area (2D speaking) between protrusions or elevations (areas which are higher with respect to adjacent areas). In an embodiment of the present invention, the protrusions may be flat and may have equal heights. In this embodiment of the present invention, the cavities may also be flat and may have equal depths (since the depth of the cavities is usually equal to the height of the protrusions). This means that the height of the protrusions is a predetermined maximum height difference. In case the protrusions and cavities are not flat, the maximum height difference between the bottom (surface) of the cavities and the top (surface) of the elevations is the predetermined maximum height. It should be understood that the maximum height difference between (the top surface of) the elevation and (the bottom surface of) the cavity may be determined and is the "predetermined maximum height difference".

In the present invention, the term "material" used herein may also be interpreted as a combination of materials.

The phrase "particles having a diameter between 1–500 nm" means that there are many particles with such a diameter. However, it should be understood that there may be particles with diameters outside this range. It should also be understood that the surface layer of the present invention may include a combination of particles with different particle size ranges, e.g. a number of particles with a diameter range between 1–20 and a number of particles with a diameter range between 50–500. Such combinations may provide a better packing. Moreover, the particles may have a random shape. In addition, it should be noted that reference to the term "diameter" does not mean that these particles need be spherically shaped.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. It should be understood that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term "substrate" used herein may also refer to a substrate that already contains multiple processed layers.

The terms "radiation" and "beam" used herein encompass all types of electromagnetic radiation, including ultraviolet (UV) radiation (e.g. having a wavelength λ of 365, 248, 193, 157 or 126 nm) and extreme ultra-violet (EUV) radiation (e.g. having a wavelength in the range of 5–20 nm), as well as particle beams, such as ion beams or electron beams. Generally, radiation having wavelengths between about 780–3000 nm (or larger) is considered IR radiation. UV refers to radiation with wavelengths of approximately 100–400 nm. Within lithography, it is usually also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100–200 nm. DUV is Deep UV, and is usually used in lithography for the wavelengths produced by excimer lasers like 126 nm–248 nm.

The term "patterning structure" used herein should be broadly interpreted as referring to structure that can be used to impart a projection beam with a pattern in its cross-section such as to create a pattern in a target portion of the substrate. It should be noted that the pattern imparted to the projection beam might not exactly correspond to the desired pattern in the target portion of the substrate. Generally, the pattern imparted to the projection beam will correspond to a particular functional layer in a device being created in the target portion, such as an integrated circuit.

Patterning structure may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned.

The support structure supports, i.e. bares the weight of, the patterning structure. It holds the patterning structure in a way depending on the orientation of the patterning structure, the design of the lithographic apparatus, and other conditions, such as for example whether or not the patterning structure is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning means is at a desired position, for example with respect to the projection system. Any use of the terms "reticle" or "mask" herein may be considered synonymous with the more general term "patterning structure".

The term "projection system" used herein should be broadly interpreted as emcompassing various types of projection system, including refractive optical systems, respective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
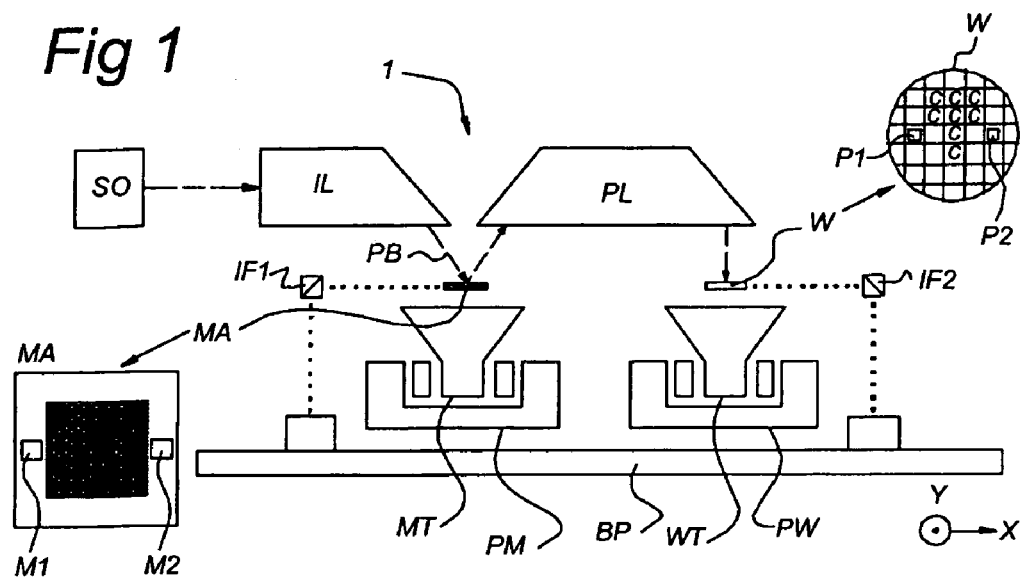
FIG. 1 schematically depicts a lithographic apparatus according to an embodiment of the invention.

FIG. 1 schematically depicts a lithographic apparatus according to a particular embodiment of the invention. The apparatus includes an illumination system (illuminator) IL configured to provide a projection beam PB of radiation (e.g. UV or EUV radiation). A first support structure (e.g. a mask table) MT is configured to support a patterning structure (e.g. a mask) MA and is connected to a first positioning device PM that accurately positions the patterning structure with respect to a projection system ("lens") PL. A substrate table (e.g. a wafer table) WT is configured to hold a substrate (e.g. a resist-coated wafer) W and is connected to second positioning device PW that accurately positions the substrate with respect to the projection system PL. The projection system (e.g. a reflective projection lens) PL images a pattern imparted to the projection beam PB by the patterning structure MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector including, for example, suitable collecting mirrors and/or a spectral purity filter. In other cases the source may be integral part of the apparatus, for example when the source is a mercury lamp. The source SO and the illuminator IL, may be referred to as a radiation system.

The illuminator IL may include adjusting device configured to adjust the angular intensity distribution of the beam. Generally, at least the outer and/or inner radial extent (commonly referred to as a-outer and a-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second, positioning structure PW and a position sensor IF2 (e.g. an interferometric device), the substrate table WT can be moved accurately, e.g. so as to position different target portions C in the path of the beam PB. Similarly, the first positioning structure PM and a position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning structure PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

In step mode, the mask table MT and the substrate table WT are kept essentially stationary, while an entire pattern imparted to the projection beam is projected onto a target portion C in a single "flash" (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above-described modes of use or entirely different modes of use may also be employed.

Figure 2:
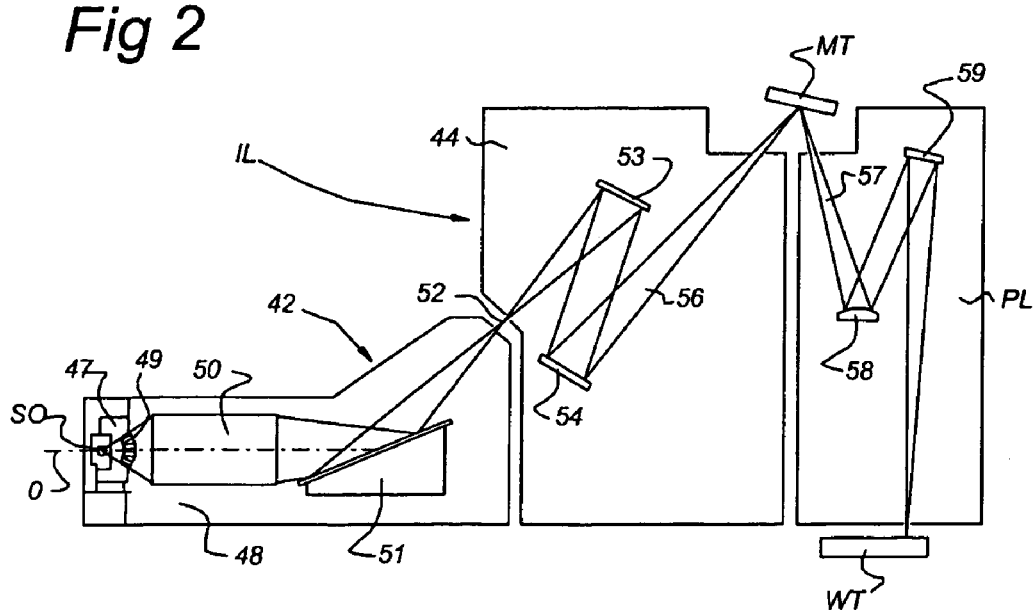
FIG. 2 schematically depicts a side view of an EUV illumination system and the projection optics of the lithographic projection apparatus shown in FIG. 1, according to an embodiment of the present invention.

FIG. 2 is a representation of the projection apparatus 1 in more detail, according to an embodiment of the present invention. The projection apparatus comprises a radiation system 42, an illumination optics unit 44, and the projection system PL. The radiation system 42 may include the radiation source SO which may be formed by a discharge plasma. EUV radiation may be produced by a gas or vapor, such as Xe gas or Li vapor in which a very hot plasma is created to emit radiation in the EUV range of the electromagnetic spectrum. The very hot plasma is created by causing a partially ionized plasma, produced by an electrical discharge, to collapse onto an optical axis O. Partial pressures of, e.g., 10 Pa of Xe or Li vapor or any other suitable gas or vapor may be required for efficient generation of the radiation. The radiation emitted by radiation source SO is passed from a source chamber 47 into a collector chamber 48 via a gas barrier structure or contamination trap 49. The gas barrier structure 49 includes a channel structure such as, for example, described in detail in European patent application EP 1 057 079 or EP 1 223 468, which are incorporated herein by reference.

The collector chamber 48 includes a radiation collector 50 which may be formed by a grazing incidence collector. Radiation passed by collector 50 is reflected off a grating spectral filter 51 to be focused in a virtual source point 52 at an aperture in the collector chamber 48. From collector chamber 48, a projection beam 56 is reflected in illumination optics unit 44, via normal incidence reflectors 53, 54, onto a reticle or mask positioned on reticle or mask table MT. A patterned beam 57 is then formed and imaged, in projection system PL via reflective elements 58, 59, onto wafer stage or substrate table WT. Although not depicted in FIG. 2, it should be understood that additional elements may be present in illumination optics unit 44 and projection system PL.

It should be noted that the radiation collector 50 illustrated in FIG. 2 may be one that is conventionally used in the industry. One example of a radiation collector that may be used in the present invention is, e.g., described in patent application EP1186957. (See especially FIGS. 3 and 4).

Figure 3:
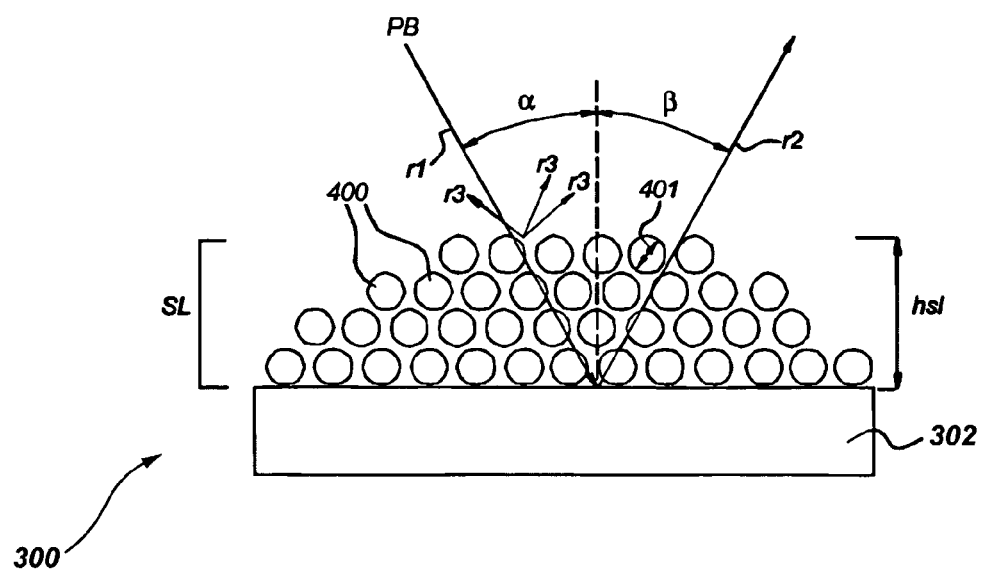
FIG. 3 schematically depicts an optical element including a surface layer with particles according to an embodiment of the present invention.

FIG. 3 describes an optical element according to the present invention. In this figure, an optical element 300, maybe, for example a mirror. However, it may also be another optical element according to the invention. In the event that the optical element is a mirror, this mirror can be, for example, a grazing incidence mirror, a normal incidence mirror or a multilayer mirror.

In this embodiment, i,e, in the embodiment where the optical element is a mirror, the optical element may be, for example, mirror 51, mirror 53, mirror 54, mirror 58, or mirror 59 illustrated in FIG. 2. It should be noted that the optical elements according to the present invention, wherein the optical element includes a mirror, can also be used at a number of these positions simultaneously. As can be seen in FIG. 3, a surface layer SL, or surface of material, with height or thickness hsl is present on the upper surface of substrate 302 of mirror 300. This surface layer SL comprises particles 400 that have a diameter 401.

The table below shows a non-exclusive range of materials that can be used as particles. The table shows the transmission of these materials for two different thicknesses, i.e., 10 and 100 nm. It should be noted, that the complex index of refraction of all the materials listed in this table is very close to unity in the region of EUV. Therefore, scattering of the EUV radiation by these particles is negligible and is therefore not included in the estimation of the transmission. The transmission of the materials listed in Table 1 is given for a theoretical sheet having a thickness of 10 and 100 nm, respectively. The numbers given in this table can, therefore, be regarded as a good first estimate for the transmission of 10 and 100 nm diameter particles, respectively.

TABLE 1 transmission of EUV radiation through layers with particles (estimation with 100% packing)

| Material | 10 nm | 100 nm |
|---|---|---|
| $Si_3N_4$ | 0.91692 | 0.42008 |
| Si | 0.98314 | 0.84366 |
| $SiO_2$ | 0.90459 | 0.36686 |
| $Al_2O_3$ | 0.69565 | 0.02654 |
| C | 0.93775 | 0.52585 |
| Mo | 0.94186 | 0.54935 |
| Sn | 0.50897 | 0.00117 |
| Ru | 0.84990 | 0.19665 |
| Zr | 0.96604 | 0.70785 |
| Fe | 0.61503 | 0.00774 |
| Au | 0.61774 | 0.00809 |
| SiC | 0.95727 | 0.64619 |

Table 1 shows the transmission of bulk material having a thickness of 10 nm and 100 nm. This transmission can be used as an approximation of the transmission of particles of the same materials, having a diameter of 10 nm and 100 nm. The table shows that the transmission of the 10 nm particles is higher than the transmission of the 100 nm particles. Therefore, it is beneficial to have small particles.

In the next table, the transmission is estimated through a layer including particles 1–10 nm radius and including Si, C, Mo or Au. The surface density describes the number of particles per $m^2$, giving a surface density (in $m^{-2}$).

TABLE 2 transmission of radiation with a wavelength of 13.5 and 100 nm through layers with particles as functions of radius, surface density and material.

| Radius (nm) | Density ($m^{-2}$) | Material | Transmission (13.5 nm) | Transmission (100 nm) |
|---|---|---|---|---|
| 5 | $10^{17}$ | Si | 92 | 20 |
| 10 | $10^{16}$ | Si | 94 | 22 |
| 4 | $10^{17}$ | C | 81 | 50 |
| 2 | $10^{18}$ | Mo | 62 | 17 |
| 1 | $10^{19}$ | Au | 13 | 11 |

From this estimated transmission, it appears that these combinations of parameters show that the contrast (transmission 13.5 nm and transmission 100 nm) is best when silicon is used.

The effect of the surface layer on a beam of radiation is shown by way of example in FIG. 3, with a beam of radiation PB. This radiation beam has an angle of incidence α relative to the normal of the upper surface of substrate 302. When, for example, particles 400 are particles having a diameter between 1–500 nm, e.g. 1–100 nm, and including for example Si, a radiation beam PB including EUV radiation may substantially be transmitted through surface layer SL and be reflected at the surface of mirror 300 (with angle β). In FIG. 3, this is shown with ray r1, which is reflected as ray r2.

Part of the radiation beam PB may include radiations with undesired wavelengths, for example DUV, UV, VIS, and/or IR radiations. Due to scattering by particles 400, for example by Mie scattering and/or Raleigh scattering, at least part of the radiations with undesired wavelengths are scattered, and will not reach the surface of mirror 300.

In an embodiment of the invention, the particles 400 are designed to have a complex index of refraction close to unity for EUV radiation. Therefore, EUV radiation will propagate through the particles 400 without being substantially absorbed and/or without being substantially scattered. However, in another embodiment of the invention, the particles 400 are also designed to have a complex index of refraction not close to unity for radiations with other wavelengths. Thus, in this embodiment, part of the radiation, that is the radiation with undesired wavelengths, will be refracted and/or scattered, and/or absorbed by particles 400. In this way, the reflected radiation, shown in FIG. 3 as ray r2, will include less radiation with undesired wavelengths.

Hence, in one embodiment of the present invention, mirror 300 provides a filter function, which can advantageously be used in e.g. lithographic apparatus, to minimize or filter out radiation selected from one or more of VUV, DUV, UV, VIS and IR radiation while allowing EUV radiation to pass. It should be understood, that this (additional) filter function may also apply to other optical elements than mirrors.

In an embodiment of the present invention, the surface layer can be provided on the optical element, e.g. by a coating (like dip coating), spraying, etc. It should be noted that in the present invention, a small damage to the layer will have a less detrimental effect, since particles are simply moved, removed or partly reorganized. This may only lead to negligible or small decrease of the filter function of the optical element. By contrast, damage to the Si protrusions of EP 1197803 may lead to a substantially decreased filter function.

Figure 4A:
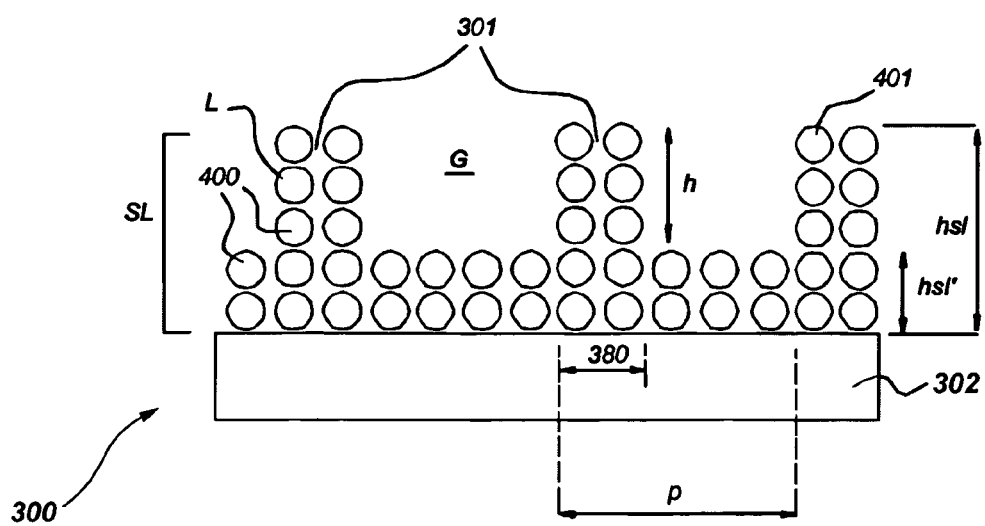
FIG. 4a schematically depicts an optical element, according to an embodiment of the present invention, including a surface layer with particles, wherein the surface layer further includes protrusions.

FIG. 4a schematically depicts an optical element, according to an embodiment of the present invention. Reference number 300, as in embodiment 1, refers again to a mirror, but may also refer to other optical elements according to the invention.

As can be seen in FIG. 4a, a surface layer or layer of material SL, including particles 400, is deposited on the upper surface of substrate 302 of optical element 300. However, in FIG. 4a, this surface layer SL includes protrusions 301, thereby providing a profile with protrusions 301 (also indicated by L) and cavities G (grooves). The protrusions 301 also include particles 400 according to the invention. In FIG. 4a, the predetermined maximum height difference between the protrusions 301 (L) and cavities G is indicated with reference symbol h. The height of surface layer SL is indicated by hsl, and the height of the part of the surface layer that substantially provides a continuous surface layer (not including the height h of the protrusions 301), is indicated with reference symbol hsl'. The width of the protrusions 301 is indicated with reference symbol 380. As can be seen in FIG. 4a, the protrusions may form a regular profile with period p of protrusions 301. In FIG. 4a, particles 400 have a diameter 401.

In an embodiment of the invention, surface layer SL may include, for example, Si particles, having diameters between 1–500 nm and a layer thickness hsl' of about 50 nm and a predetermined maximum height difference h of about 500 nm.

It should be noted that, by selecting, for example, a period p between 200–500 nm, one may provide a grating profile. It should also be noted that, an optical element 300 including a surface layer SL with such grating profile may have an additional filter function. Thus, not only DUV, UV and VIS may be filtered out due to scattering and absorption of radiation by the particles, but due to the grating profile, IR radiation may also be partially filtered out, or may more effectively be filtered out (with respect to such surface layer SL without protrusions 301). By way of example, this is shown in more detail in FIG. 4b, which illustrates an optical element according to another embodiment of the present invention.

Figure 4B:
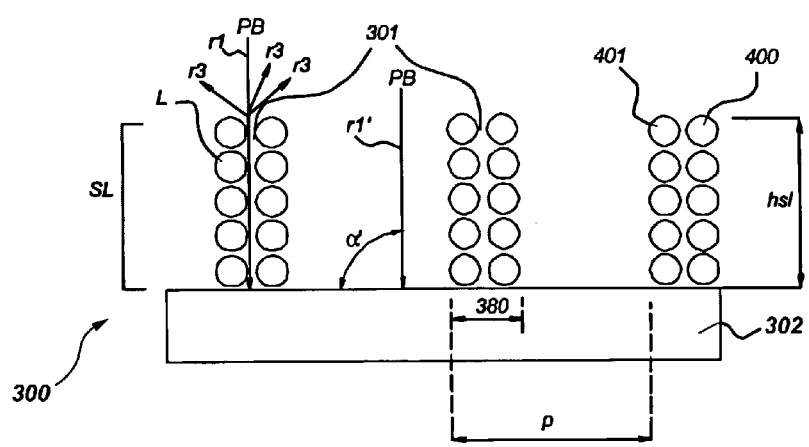
FIG. 4b schematically depicts an optical element, according to an embodiment of the present invention, including a surface layer with particles, wherein the surface layer includes protrusions.

FIG. 4b, which corresponds to a variation of the embodiment of FIG. 4a, shows a surface layer or layer of material SL wherein only protrusions 301 are present. In this embodiment, the surface layer SL is a discontinuous layer. It should be noted that, in FIG. 4b, the height hsl refers to the (mean) height of the protrusions.

As can be seen in FIG. 4b, radiation beam PB comprises two rays: ray r1 and ray r1'. Ray r1 propagates through protrusion 301 and reaches the surface of optical element 300. Ray r1' reaches the surface of surface layer SL without propagating through protrusion 301. In this figure, the angle of incidence α' (or ray r1 and r1') is defined with respect to the surface of optical element 300, and is 90°. In the embodiment illustrated in FIG. 4b, the radiation with desired wavelengths (e.g. EUV radiation) will propagate through protrusion 301 without being substantially absorbed, and without being subjected to a substantial phase change. This is due to the fact that the surface layer SL includes a material that is at least partially transmissive for EUV radiation, and more specifically a material having a complex refractive index close to unity for EUV, By contrast, in this embodiment, radiation with other wavelengths (radiation with undesired wavelengths), may be absorbed and/or scattered by the surface layer SL.

In FIG. 4b, scattered rays are shown by ray's r3. Furthermore, it should be noted that, radiations having undesired wavelengths that are transmitted through protrusion 301, like e.g. ray r1, will have a phase different from the phase of ray r1'. It is possible to reduce, or at least partially eliminate, radiation with undesired wavelengths by interference. Hence, by selecting height hsl, width 301, period p, the material of surface layer SL, and the angle of incidence α', one may provide an optical filter for filtering out radiation with undesired wavelengths, for example IR radiation.

For example, a simple protrusion structure with protrusion of 200 nm width, 400 nm height, and a period of 1000 nm on a 100 nm thin silicon filter may reduce the transmission of such filter to a value lower than 4% in the wavelength region from 1500 to 2000 nm. It should be noted that silicon is optically almost equal to vacuum for EUV radiation of about 13.5 nm. Therefore, the EUV-projection beam is not significantly affected by silicon protrusion structures. For 13.5 nm radiation, it has been demonstrated that approximately 75.3% of the beam may be transmitted in the zero$^{th}$ order, while 1.2% of the beam may be transmitted in higher interference orders (assuming 100% packing).

It should be understood that other structures, for example two-dimensional gratings, chirped gratings, blazed gratings, and other bar structures, may also be used in other embodiments of the present invention.

It should be noted that the height of surface layer or layer of material SL in FIG. 3, height hsl, and the height of surface layer SL in FIG. 4a, height hsl', describe the (mean) height of that part of the surface layer SL that substantially provides a closed surface layer on the upper surface of substrate 302 of optical element 300. By contrast, it should be noted that the optical element of FIG. 4b includes a semi-continuous layer, which provides a non-closed surface on optical element 300. Height hsl' in FIG. 4a is the effective height of the continuous surface layer, and does not include the height h of the protrusions 301.

Referring now to the embodiments which are schematically depicted in FIGS. 3 and 4a, the height of the continuous layer on optical element 300 (height hsl in FIG. 3 or height hsl' in FIG. 4a), may be chosen such that, e.g., IR radiation is more effectively blocked. This may be performed by choosing this height (hsl in FIG. 3; hsl' in FIG. 4a) equal to $\lambda_{un}/(4*\tilde{n}_{eff}*\cos(\alpha))$.

In this embodiment, $\tilde{n}_{eff}$ is the effective complex index of refraction of the surface layer for radiation with wavelength $\lambda_{un}$. $\lambda_{un}$ refers to the radiation with undesired wavelengths, especially an IR radiation. Since the wavelength of an IR radiation is much larger than the particle size, the radiation is not able to distinguish separate particles. Therefore, the surface layer is 'seen' as a bulk material with an average index of refraction, i.e. an effective complex index of refraction (averaging the indices of refraction of the packed part of the surface layer SL and the unpacked (voids) part of this layer). When the radiation beam PB reaches the surface perpendicularly, the angle of incidence α=0, and the height is equal to $\lambda/(4*\tilde{n}_{eff})$.

By choosing the layer thickness hsl' in a range of 10 nm–500 nm, an additional filter function may be added because, at such layer thickness hsl (hsl') of surface layer SL, IR radiation is filtered out even more efficiently, e.g. due to destructive interference.

While specific embodiments of the invention have been described above, it will be appreciated that the invention may be practiced otherwise than as described. The description is not intended to limit the invention.

Furthermore, although some of the embodiments especially describe EUV applications and EUV optical elements, it should be understood that the invention can also be applied to optical elements configured to work in other spectral ranges, like e.g. DUV, VUV, UV or VIS. In addition, the present invention is not limited to lithographic applications. It should also be noted that elements and features, which are necessary to understand the invention, have been depicted in the drawings and that the invention is not limited to those elements. For example, it should be understood that additional layers may be present on the substrate of the optical element and that additional surfaces of the optical element may be covered with the layer of material.

What is claimed is:

1. An optical element, comprising:
    a substrate having at least one surface on which a layer of material is disposed, said layer of material being selected to be at least partially transmissive to radiation with a predetermined wavelength λ lower than 100 nm and to substantially eliminate a radiation greater than 100 nm,
    wherein the layer of material comprises particles having a diameter in a range of 1–500 nm and the layer of material has a layer thickness in the range of 10–2000 nm.

2. An optical element according to claim 1, wherein the particles are at least partially transmissive to EUV radiation.

3. An optical element according to claim 1, wherein the particles comprise a material having a complex refractive index close to unity at the predetermined wavelength λ.

4. An optical element according to claim 1, wherein the particles comprise a material selected from at least one of Be, B, C, Si, P, S, K, Ca, Sc, Br, Rb, Sr, Y, Zr, Nb, Mo, Ru, Rh, Ag, Ba, La, Ce, Pr, Ir, Au, Pa and U.

5. An optical element according to claim 1, wherein the optical element is an element selected from optical filters, optical gratings, mirrors, and lenses.

6. An optical element according to claim 1, wherein the layer of material comprises protrusions that form cavities and elevations within the layer of material, said protrusions being periodically arranged within the layer of material.

7. An optical element according to claim 6, wherein the cavities and the elevations have a predetermined maximum height difference.

8. An optical element according to claim 6, wherein a period of the protrusions is in the range of 200–5000 nm.

9. An optical element according to claim 7, wherein the height difference is in the range of 10–500 nm.

10. An optical element according to claim 1, wherein the layer of material has a layer thickness in the range of 10–500 nm.

11. An optical element according to claim 6, wherein the protrusions have a profile selected from a laminar sawtooth profile, a square wave profile and a rectangle wave profile.

12. An optical element according to claim 6, wherein the protrusions are periodically arranged in one direction to form a 1-D grating or in two directions to form a 2-D grating.

13. An optical element according to claim 6, wherein the layer of material is a discontinuous layer.

14. An optical element according to claim 13, wherein an empty space is provided between the protrusions.

15. An optical element according to claim 14, wherein the protrusions are configured to create a 180° phase shift to undesired radiations transmitted through the protrusions.

16. An optical element according to claim 1, wherein the thickness of the layer of material is substantially equal to $$\frac{\lambda_{un}}{(4 * n_{eff} * \cos(\alpha))},$$

wherein $\lambda_{un}$ is an undesired radiation wavelength, $n_{eff}$ is the average index of refraction of the layer of material and α is the angle of incidence of the radiation.

17. A method for diminishing the intensity of radiation selected from one or more of VUV, DUV, UV, VIS and IR radiation in a radiation beam of an optical system, the method comprising projecting the radiation beam onto at least one optical element comprising a substrate having at least one surface on which a layer of material is disposed, said layer of material being selected to be at least partially transmissive to radiation with a predetermined wavelength λ lower than 100 nm and to substantially eliminate a radiation greater than 100 nm, wherein the surface of material comprises particles having a diameter in a range of 1–500 nm and the layer of material has a layer thickness in the range of 10–2000 nm.

18. A device manufacturing method, comprising:
    providing a beam of radiation;
    patterning the beam of radiation;
    projecting the patterned beam of radiation onto a target portion of a layer of radiation-sensitive material, and
    passing the radiation through a layer of material disposed on at least one optical element, said layer of material being selected to be at least partially transmissive to radiation with a predetermined wavelength λ lower than 100 nm and to substantially eliminate a radiation greater than 100 nm, wherein the surface of material comprises particles having a diameter in a range of 1–500 nm, and the layer of material has a layer thickness in the range of 10–2000 nm.

19. A device manufacturing method according to claim 18, wherein the at least one optical element is a lens.

20. A device manufacturing method according to claim 18, wherein the at least one optical element is a mirror.

21. A lithographic projection apparatus, comprising:
    a radiation system constructed and arranged to provide a beam of radiation;
    a support structure constructed and arranged to supporting a patterning structure, the patterning structure constructed and arranged to pattern the beam according to a desired pattern;
    a substrate table to hold a substrate;
    a projection system constructed and arranged to project the patterned beam onto a target portion of the substrate; and
    at least one optical element within a path of the radiation comprising a substrate having at least one surface on which a layer of material is disposed, said layer of material being selected to be at least partially transmissive to radiation with a predetermined wavelength λ lower than 100 nm and to substantially eliminate a radiation greater than 100 nm, wherein the surface of material comprises particles having a diameter in a range of 1–500 nm, and the layer of material has a layer thickness in the range of 10–2000 nm.

* * * * *